United States Patent
Chang et al.

(10) Patent No.: US 9,812,370 B2
(45) Date of Patent: Nov. 7, 2017

(54) III-V, SIGE, OR GE BASE LATERAL BIPOLAR TRANSISTOR AND CMOS HYBRID TECHNOLOGY

(71) Applicant: International Business Machines Corporation, Armonk, NY (US)

(72) Inventors: Josephine B. Chang, Ellicott City, MD (US); Gen P. Lauer, Yorktown Heights, NY (US); Isaac Lauer, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/332,207

(22) Filed: Oct. 24, 2016

(65) Prior Publication Data

US 2017/0040219 A1   Feb. 9, 2017

Related U.S. Application Data

(62) Division of application No. 14/245,627, filed on Apr. 4, 2014, now Pat. No. 9,496,184.

(51) Int. Cl.
*H01L 21/336* (2006.01)
*H01L 21/8249* (2006.01)
(Continued)

(52) U.S. Cl.
CPC ........ *H01L 21/8249* (2013.01); *H01L 21/244* (2013.01); *H01L 21/84* (2013.01);
(Continued)

(58) Field of Classification Search
CPC ........ H03F 3/3005; H01L 21/71; H01L 21/00
See application file for complete search history.

(56) References Cited

U.S. PATENT DOCUMENTS 7,671,447 B2   3/2010   Montree et al.
7,772,060 B2   8/2010   Jumpertz et al.
(Continued)

FOREIGN PATENT DOCUMENTS

CN   102592998 A   7/2012
CN   102723361 A   10/2012
(Continued)

OTHER PUBLICATIONS

List of IBM Patents or Applications Treated as Related.
(Continued)

*Primary Examiner* — Selim Ahmed
*Assistant Examiner* — André C Stevenson
(74) *Attorney, Agent, or Firm* — Louis J. Percello; Michael J. Chang, LLC

(57) ABSTRACT

In one aspect, a method of fabricating a bipolar transistor device on a wafer includes the following steps. A dummy gate is formed on the wafer, wherein the dummy gate is present over a portion of the wafer that serves as a base of the bipolar transistor. The wafer is doped to form emitter and collector regions on both sides of the dummy gate. A dielectric filler layer is deposited onto the wafer surrounding the dummy gate. The dummy gate is removed selective to the dielectric filler layer, thereby exposing the base. The base is recessed. The base is re-grown from an epitaxial material selected from the group consisting of: SiGe, Ge, and a III-V material. Contacts are formed to the base. Techniques for co-fabricating a bipolar transistor and CMOS FET devices are also provided.

10 Claims, 5 Drawing Sheets

(51) Int. Cl.
  *H01L 29/66* (2006.01)
  *H01L 21/24* (2006.01)
  *H01L 29/10* (2006.01)
  *H01L 29/45* (2006.01)
  *H01L 29/735* (2006.01)
  *H01L 27/06* (2006.01)
  *H01L 21/84* (2006.01)

(52) U.S. Cl.
  CPC ...... *H01L 27/0623* (2013.01); *H01L 29/1008* (2013.01); *H01L 29/456* (2013.01); *H01L 29/6625* (2013.01); *H01L 29/66545* (2013.01); *H01L 29/735* (2013.01)

(56) References Cited

U.S. PATENT DOCUMENTS

| | | | |
|---|---|---|---|
| 8,329,541 | B2 | 12/2012 | Ye et al. |
| 8,497,169 | B2 | 7/2013 | Chang et al. |
| 8,709,890 | B2 | 4/2014 | Cheng et al. |
| 9,525,027 | B2* | 12/2016 | Hashemi ............ H01L 29/1008 |
| 2010/0047987 | A1 | 2/2010 | Donkers et al. |
| 2012/0314485 | A1 | 12/2012 | Cai et al. |
| 2015/0263168 | A1* | 9/2015 | Hsiao ............... H01L 29/66492 257/402 |

FOREIGN PATENT DOCUMENTS

| | | |
|---|---|---|
| CN | 102738158 A | 10/2012 |
| CN | 102738160 A | 10/2012 |
| CN | 102738178 A | 10/2012 |
| CN | 102751292 A | 10/2012 |

OTHER PUBLICATIONS

Helmut Foll, "Semiconductors I, 5.1.4 Wavelength Engineering" Kiel University, Germany (accessed on Aug. 14, 2013).
Li et al., "The base dopant out diffusion and the optimized setback layers in SiGe HBT," Proceedings from the 6th International Conference on Solid-State and Integrated-Circuit Technology 2001, vol. 1, pp. 596-599 (Oct. 2001).
Computer translation of CN102592998 (Feb. 2013).
Computer translation of CN102723361 (Feb. 2013).
Computer translation of CN102738158 (Feb. 2013).
Computer translation of CN102738160 (Feb. 2013).
Computer translation of CN102738178 (Feb. 2013).
Computer translation of CN102751292 (Feb. 2013).

* cited by examiner

III-V, SIGE, OR GE BASE LATERAL BIPOLAR TRANSISTOR AND CMOS HYBRID TECHNOLOGY

CROSS-REFERENCE TO RELATED APPLICATIONS

This application is a divisional of U.S. application Ser. No. 14/245,627 filed on Apr. 4, 2014, the contents of which are incorporated by reference herein.

FIELD OF THE INVENTION

The present invention relates to lateral bipolar transistor and CMOS hybrid technology and more particularly, to techniques for integrating a III-V, SiGe, or Ge base lateral bipolar transistor with CMOS technology.

BACKGROUND OF THE INVENTION

Bipolar transistors are electronic devices with two P-N junctions that are in close proximity to one another. A common bipolar transistor has three regions: i) an emitter, ii) a collector, and iii) a base present between the emitter and the collector. If the emitter and the collector are doped with an n-type dopant and the base is doped with a p-type dopant, then the device is an "NPN" transistor. Alternatively, if the emitter and the collector are doped with a p-type dopant and the base is doped with an n-type dopant, then the device is a "PNP" transistor.

Despite the prevalence of CMOS FETs, bipolar transistors have superior device attributes in some areas, especially for analogue and power gain applications. Conventional bipolar devices require abrupt emitter-to-base junctions and well controlled base region lengths and are typically not scaled for circuit density of CMOS structures.

Therefore, improved bipolar transistor designs and techniques for fabrication thereof would be desirable, especially when compatible with CMOS FET fabrication processes.

SUMMARY OF THE INVENTION

The present invention provides techniques for integrating a III-V, SiGe, or Ge base lateral bipolar transistor with CMOS technology. In one aspect of the invention, a method of fabricating a bipolar transistor device on a wafer is provided. The method includes the following steps. A dummy gate is formed on the wafer, wherein the dummy gate is present over a portion of the wafer that serves as a base of the bipolar transistor. The wafer is doped to form emitter and collector regions on both sides of the dummy gate. A dielectric filler layer is deposited onto the wafer surrounding the dummy gate. The dummy gate is removed selective to the dielectric filler layer, thereby exposing the base. The base is recessed. The base is re-grown from an epitaxial material selected from the group consisting of: SiGe, Ge, and a III-V material. Contacts are formed to the base.

In another aspect of the invention, a method of co-fabricating at least one CMOS FET device and at least one bipolar transistor device on a wafer is provided. The method includes the following steps. At least one CMOS FET dummy gate and at least one bipolar transistor dummy gate are formed on the wafer, wherein the CMOS FET dummy gate is present over a portion of the wafer that serves as a channel region of the CMOS FET device and the bipolar transistor dummy gate is present over a portion of the wafer that serves as a base of the bipolar transistor. The wafer is doped to form emitter and collector regions on both sides of the bipolar transistor dummy gate. The wafer is doped to form source and drain regions on both sides of the CMOS FET dummy gate. A dielectric filler layer is deposited onto the wafer surrounding the CMOS FET dummy gate and the bipolar transistor dummy gate. The CMOS FET dummy gate and the bipolar transistor dummy gate are removed selective to the dielectric filler layer, wherein removal of the CMOS FET dummy gate results in at least one first trench being formed in the dielectric filler layer and removal of the bipolar transistor dummy gate results in at least one second trench being formed in the dielectric filler layer. The base of the bipolar transistor is recessed. The base of the bipolar transistor is re-grown from an epitaxial material selected from the group consisting of: SiGe, Ge, and a III-V material. A replacement gate of the CMOS FET device is formed in the first trench over the channel region of the CMOS FET device. Contacts are formed to the replacement gate of the CMOS FET device and to the base of the bipolar transistor device.

In yet another aspect of the invention, a bipolar transistor device is provided. The device includes emitter and collector regions formed in a wafer; and a base formed in the wafer between the emitter and collector regions, wherein a portion of the wafer in which the base is formed is recessed and contains an epitaxial material selected from the group consisting of: SiGe, Ge, and a III-V material.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for fabricating lateral PNP or NPN bipolar transistors using a replacement gate-based process flow. Advantageously, the present techniques can be used in combination with either implant and/or solid source diffusion to make abrupt junction base regions. At the same time as forming the lateral bipolar regions, other regions can be processed with a replacement gate flow for CMOS field-effect transistors (FETs). Doing this allows for both bipolar devices and CMOS FETs on the same chip, allowing a designer to use either, whichever is best.

Further, conventional bipolar transistors have silicon (Si)-based designs. See, for example, U.S. patent application Ser. No. 13/607,877, filed by J. Sleight et al., entitled "A Lateral Bipolar Transistor and CMOS Hybrid Technology," the entire contents of which are incorporated by reference herein. However, the use of materials other than Si can lead to design performance enhancements. For instance, III-V materials can have significantly higher electron mobility than Si.

The present techniques are now described by way of reference to FIGS. 1-15 which provide an exemplary methodology for co-fabricating a CMOS FET and a lateral bipolar transistor on a wafer. For illustrative purposes, the figures illustrate the formation of one CMOS FET and one lateral bipolar transistor. However, it is to be understood that multiple FETs and/or multiple bipolar transistors can be formed in the same manner as now described. Further, while the present bipolar transistor fabrication techniques are shown integrated with a CMOS FET process flow, if so desired the present techniques may be implemented, in the same manner described herein, to fabricate a bipolar transistor device(s) alone, i.e., independent of other devices on the wafer. Thus, it is to be understood that the depiction of the fabrication of a CMOS FET(s) and a bipolar transistor(s) concurrently on a wafer is only an example intended to show how the present techniques are compatible with a FET fabrication process.

Figure 1:
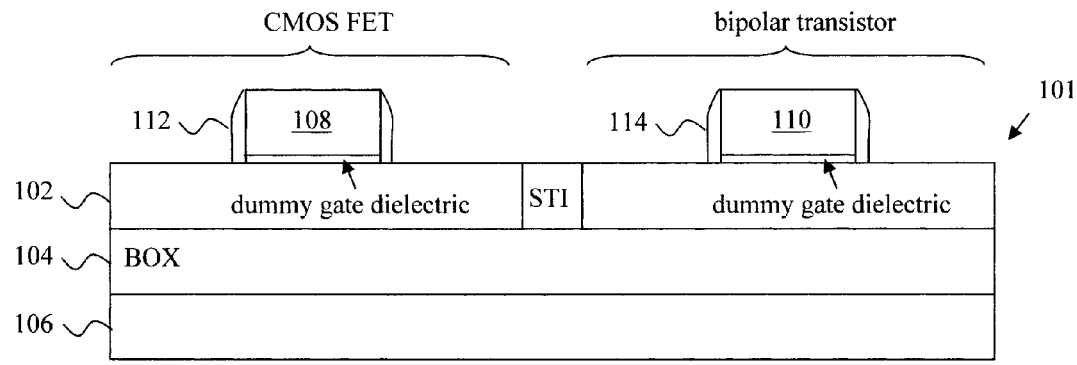
FIG. 1 is a cross-sectional diagram illustrating a starting platform for an integrated CMOS FET and lateral bipolar transistor process flow, including a SOI wafer, CMOS FET and bipolar transistor dummy gates on the wafer, and spacers adjacent to the dummy gates according to an embodiment of the present invention.

As shown in FIG. 1 the starting platform for the process is a semiconductor wafer, such as a bulk semiconductor (e.g., silicon (Si), silicon germanium (SiGe), Ge, etc.) or semiconductor-on-insulator (SOI) wafer. In the example depicted in FIG. 1, a SOI wafer 101 is employed. As shown in FIG. 1, the SOI wafer 101 includes an SOI layer 102 separated from a substrate 106 by a buried oxide (or BOX) 104.

The SOI layer 102 is formed from a semiconductor material including, but not limited to, Si, SiGe, Ge, and a III-V semiconductor material. The term III-V semiconductor material (or simply III-V material), as used herein and throughout the following description, refers to a material that includes at least one group III element and at least one group V element. By way of example only, suitable III-V materials include, but are not limited to, one or more of aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium nitride, indium nitride, indium phosphide and combinations including at least one of the foregoing materials. According to an exemplary embodiment, the III-V material is indium gallium arsenide (InGaAs).

As highlighted above, by way of non-limiting example, the figures will depict the formation of one CMOS FET and one lateral bipolar transistor on the wafer. Accordingly, for clarity of depiction, these regions "CMOS FET" and "bipolar transistor" are shown labeled in the figures. Further, as shown in FIG. 1, the active regions of the wafer (i.e., in which the devices will be formed) are separated using standard isolation techniques, such as shallow trench isolation (STI).

As provided above, the present techniques utilize a replacement gate-based approach. Namely, as shown in FIG. 1, at least one dummy gate 108 is formed on the wafer in the CMOS FET region and at least one dummy gate 110 is formed on the wafer in the bipolar transistor region. As shown in FIG. 1, the dummy gates 108 and 110 are separated from the SOI layer 102 by a dummy gate dielectric.

According to an exemplary embodiment, the dummy gates are formed concurrently in the CMOS FET and bipolar transistor regions by first forming an interfacial oxide on the SOI layer 102 which will serve as the dummy gate dielectric. This oxide (e.g., silicon dioxide ($SiO_2$)) can be deposited onto SOI layer 102, or grown from SOI layer 102 using an oxidation process, such as thermal oxidation. As will be described in detail below, the dummy gate oxide serves as an etch stop layer. Namely, during the dummy gate removal step (see below), the presence of an etch stop layer permits the dummy gate material to be removed selective to the underlying SOI.

Next, a suitable dummy gate material (e.g., poly-silicon) can then be blanket deposited onto the wafer, over the interfacial (dummy gate) oxide. Standard lithography and etching processes can then be performed to pattern the dummy gate material and interfacial oxide with the footprints and locations of the dummy gates, thus forming dummy gate 108 (and dummy gate oxide) in the CMOS FET region and dummy gate 110 (and dummy gate oxide) in the bipolar transistor region. As will become apparent from the description that follows, the dummy gate 108 is present over a portion of the wafer that serves as a channel region of the CMOS FET device, and the dummy gate 110 is present over a portion of the wafer that serves as a base of the bipolar FET device.

As shown in FIG. 1, spacers 112 and spacers 114 are then formed on opposite sides of the dummy gates 108 and 110, respectively. According to an exemplary embodiment, the spacers are formed concurrently in the CMOS FIT and bipolar transistor regions by first depositing a spacer material (e.g., a nitride material such as silicon nitride), and then patterning the material to form the spacers 112/114.

Next, the collector and emitter doping in the bipolar transistor region of the wafer is performed. See FIG. 2. In the case where a CMOS FET(s) are being fabricated on the same wafer (such as in the example of FIG. 2), it is preferable to first mask the CMOS FETs (e.g., using a resist or hardmask) to prevent doping in the FET devices. Suitable hardmask materials include, but are not limited to, nitride materials such as silicon nitride (SiN). Standard lithography and etching techniques can be used to pattern the mask.

Figure 2:
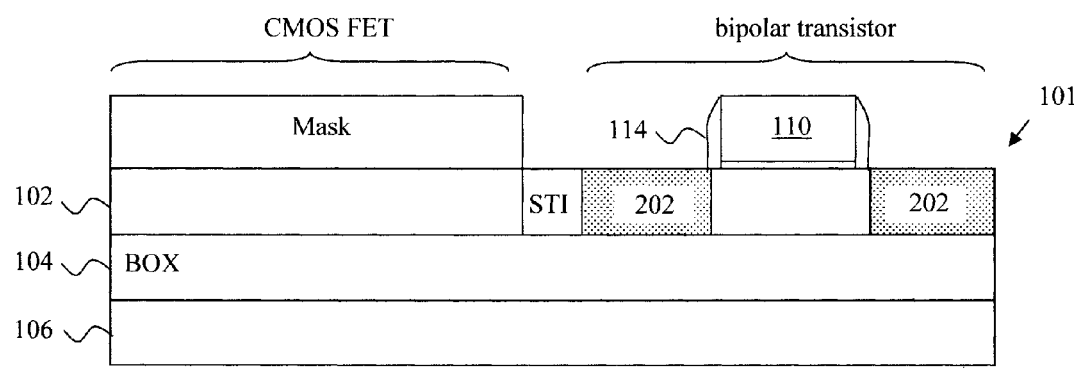
FIG. 2 is a cross-sectional diagram illustrating doping having been used to form collector/emitter regions on both sides of the bipolar transistor dummy gate, while the CMOS FET is masked according to an embodiment of the present invention.

As shown in FIG. 2, collector/emitter doping is then performed to form doped collector/emitter regions 202 (either N+ or P+) on both sides of the dummy gate 110. Conventional doping processes can be employed. Alternatively, the doping can be also be achieved using solid source diffusion. In either case, the dopant dose can be from about $5 \times 10^{18}$ atoms/cm$^3$ to about $5 \times 10^{20}$ atoms/cm$^3$, e.g., from about $5 \times 10^{19}$ atoms/cm$^3$ to about $2 \times 10^{20}$ atoms/cm$^3$. In an NPN bipolar transistor configuration, both sides of dummy the gate 110 can receive a number of successive implants of boron ions at various energies. In a PNP bipolar transistor configuration, both sides of the dummy gate 110 can receive successive implantation steps of either arsenic or phosphoric ions.

Figure 3:
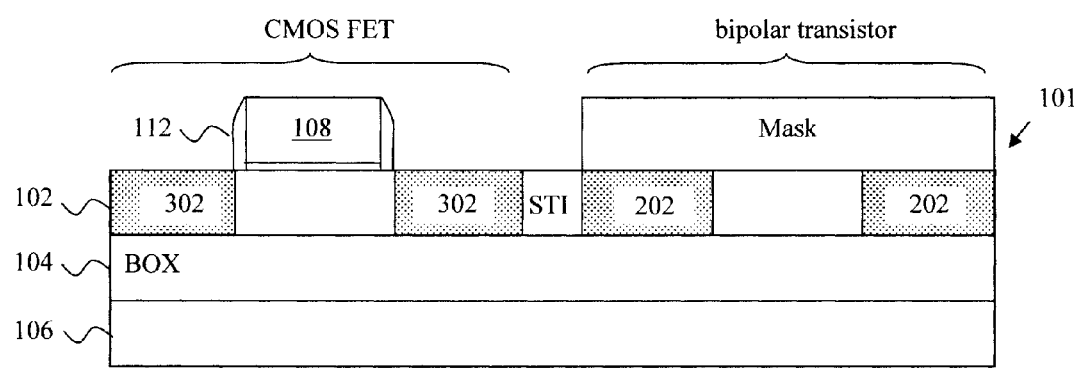
FIG. 3 is a cross-sectional diagram illustrating doping having been used to form source/drain regions on both sides of the CMOS FET dummy gate, while the bipolar transistor is masked according to an embodiment of the present invention.

Following the collector/emitter doping, the mask can be removed from the CMOS FET device(s). The same general process can also be used dope source/drain regions 302 on both sides of the dummy gate 108. See FIG. 3. As shown in FIG. 3, a mask (e.g., resist or hardmask) can be formed covering the bipolar transistors (in the same manner as described above), and a conventional dopant implantation process can be used to form the source and drain regions 302 of the FET device(s). The order in which the collector/emitter (FIG. 2) and source/drain doping (FIG. 3) is performed is immaterial and these processes can be performed in either order. Following the source/drain doping, the mask can be removed from the bipolar transistor device(s).

Figure 4:
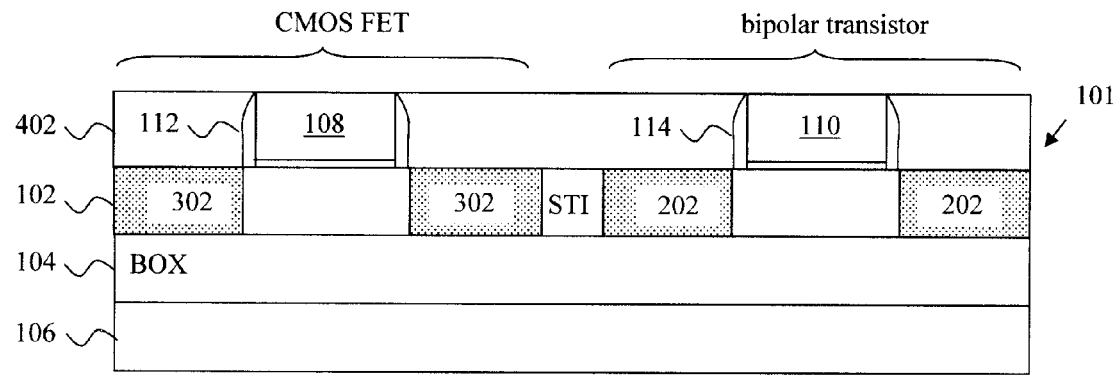
FIG. 4 is a cross-sectional diagram illustrating a dielectric filler layer having been deposited onto the wafer, surrounding the dummy gates according to an embodiment of the present invention.

Next, a dielectric filler layer 402 is blanket deposited onto the wafer, surrounding the dummy gates. See FIG. 4. As shown in FIG. 4, the dielectric filler layer 402 is then planarized down to a top of the dummy gates. This will permit removal of the dummy gates later in the process. Planarization of the dielectric filler layer 402 can be performed using chemical mechanical polishing (CMP).

In the description that follows, steps are provided first for forming an epitaxial material as the base of the bipolar transistor device(s) followed by replacement gate processing in the CMOS FET device(s). This sequence is presented only as an example. The steps described herein can be performed in any order, and in some cases steps can be performed concurrently with one another.

Figure 5:
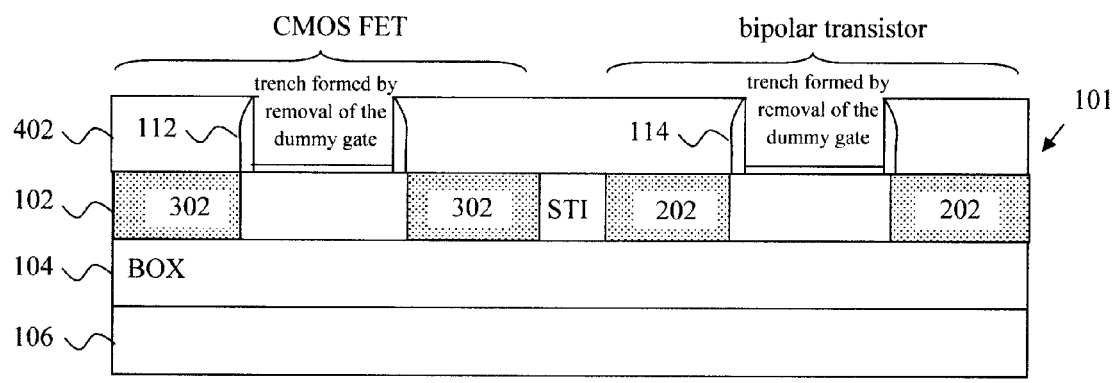
FIG. 5 is a cross-sectional diagram illustrating the dummy gates having been removed from the CMOS FET and bipolar transistor devices according to an embodiment of the present invention.
Figure 6:
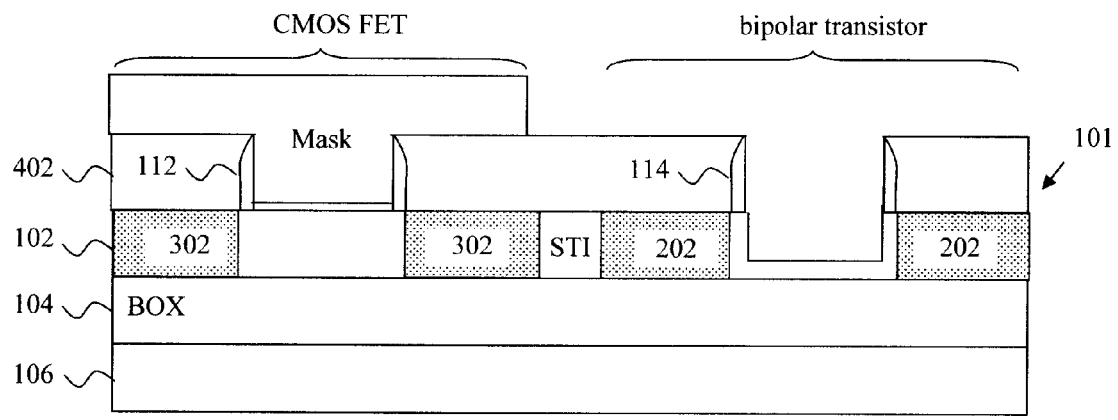
FIG. 6 is a cross-sectional diagram illustrating masking of the CMOS FET device(s) and the base in the bipolar transistor device(s) having been recessed according to an embodiment of the present invention.

Thus, by way of example only, as shown in FIG. 5, the dummy gates 108 and 110 are next removed from the CMOS FET and bipolar transistor devices. The dummy gates 108 and 110 can be removed selective to the dielectric filler layer 402 and spacers 112/114 using wet chemical etching or dry etching. Removal of the dummy gates results in trenches being formed in the dielectric filler layer. In the case of the bipolar transistor device(s), removal of the dummy gate exposes the base.

In order to permit selective processing of the bipolar transistor device(s), following the dummy gate removal the CMOS FET device(s) are masked (e.g., with a resist or hardmask). See FIG. 6.

Next, the base in the bipolar transistor device(s) is/are recessed. See FIG. 6. This base recess can be performed using a selective etch, such as a selective reactive ion etching (RIE) process. The emitter and collector are covered/protected by the dielectric filler layer 402 and (as provided above) the CMOS FET device(s) are masked.

A RIE process, for example, is anisotropic and if employed will result in portions of the (SOI) base below/masked by the spacers 114 to remain following the base recess etch. See FIG. 6. Further, the etch should be endpointed prior to removing all of the (SOI) at the bottom of the base. These remaining portions of the SOI at the bottom and sides of the base will be used to template re-growth of the base using SiGe, Ge or a III-V semiconductor material.

Figure 7:
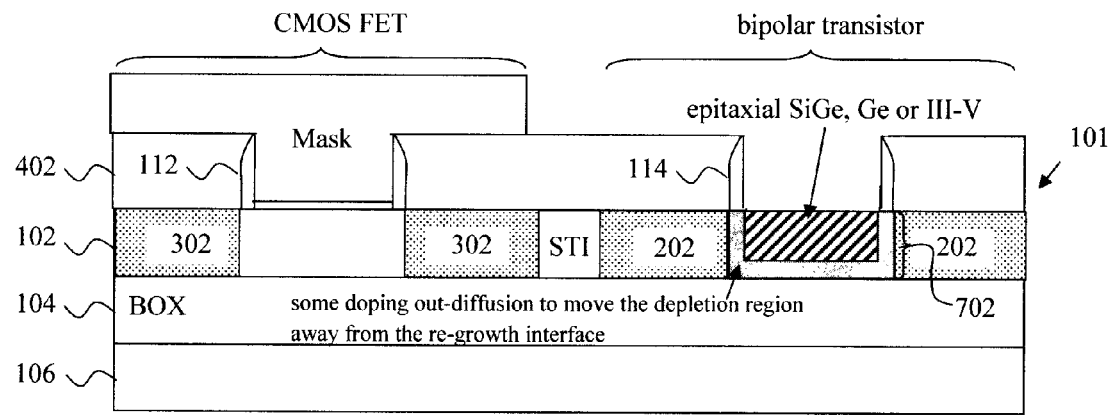
FIG. 7 is a cross-sectional diagram illustrating re-growth of the base in the bipolar transistor device(s) from an epitaxial SiGe, Ge or III-V semiconductor material according to an embodiment of the present invention.

Namely, as shown in FIG. 7, epitaxial re-growth of the base in the bipolar transistor device(s) is next performed. According to an exemplary embodiment, the base is re-grown at this stage from an epitaxial SiGe, Ge or III-V semiconductor material 702. Re-growth of the base material permits the base to be formed from a different material than the collector and emitter regions (i.e., that of the SOI layer 102). In fact, the material from which to re-grow the base is preferably chosen such that the bandgap in the base is smaller than the bandgap of the collector/emitter. As provided above, the collector/emitter regions are formed from doped portions of the SOI layer 102. As also provided above, the SOI layer can be formed from a semiconductor material, such as Si, SiGe, Ge, and a III-V semiconductor material. Thus, depending on the contents of SOI layer 102, the base is preferably re-grown from a material with a lower bandgap than the SOI layer. Bandgap data for each of the above-described SOI and base materials may be found in the published literature. See, for instance, Helmut Foll, "Semiconductors 1, 5.1.4 Wavelength Engineering" Kiel University, Germany (accessed on Aug. 14, 2013) (which on page 1 of section 5.1.4 provides bangap and lattice constant data for a variety of different materials, including Si, Ge, and III-V materials) (hereinafter "Foll"), the entire contents of which are incorporated by reference herein. In the bandgap charts provided in Foll, the lines represent alloys of the materials. Thus one can adjust the bandgap along those lines. Therefore, selection of the SOI and base materials can be performed accordingly. To use a simple example, if the collector and emitter regions (based on the composition of SOI layer 102) are formed from gallium arsenide, then a suitable choice for the base might be epitaxial Ge, since Ge has a lower bandgap than gallium arsenide (see Foll).

Further, the base can be doped in-situ during this re-growth process. Suitable dopants include, but are not limited to boron (p-type) and phosphorous (n-type). By way of example only, a suitable base doping concentration is from about $1 \times 10^{17}$ cm$^3$ to about $1 \times 10^{18}$ cm$^3$, e.g., from about $2 \times 10^{17}$ cm$^3$ to about $5 \times 10^{17}$ cm$^3$. It is notable that doping the base at this stage is optional, and the base can be doped later in the process.

When in-situ doping is performed, as shown in FIG. 7, some dopant out-diffusion is preferable to move the depletion region away from the re-growth interface. Base dopant out-diffusion is described generally in Li et al., "The base dopant out diffusion and the optimized setback layers in SiGe HBT," Proceedings from the 6$^{th}$ International Conference on Solid-State and Integrated-Circuit Technology 2001, vol. 1, pgs. 596-599 (October 2001), the entire contents of which are incorporated by reference herein. Out-diffusion can be accomplished using an anneal to "out-diffuse" the dopant(s).

Moving the depletion region away from the re-growth interface (e.g., via out-diffusion) is important since the (epitaxial) re-growth interface is the location most likely to contain crystal defects caused by factors such as like lattice mismatch. A small amount of lattice mismatch can be tolerated and results in elastic deformation of the materials (strain sharing). A large amount of lattice mismatch however results in plastic deformation (defects) such as so-called misfit defects. Defects in the depletion region act as carrier generation/recombination centers that reduce the gain of bipolar transistors. So, an anneal that moves the doping far enough that the defects are in a quasi-neutral region is advantageous. The amount of diffusion depends on the width of the depletion region which depends on the doping concentration and the applied biases, as so:

$$W \approx \left[ \frac{2 \epsilon_r \epsilon_0}{q} \left( \frac{N_A + N_D}{N_A N_D} \right) (V_{bi} - V) \right]^{\frac{1}{2}}$$

By way of example only, when the collector/emitter are highly doped (e.g., as per the exemplary collector and emitter doping concentrations provided in conjunction with the description of FIG. 2, above) the depletion region is preferably moved a distance of less than about 10 nanometers (nm) (e.g., from about 1 nm to about 8 nm) away from the re-growth interface. To use an illustrative, non-limiting example: when the base material is epitaxial Si or SiGe, an anneal at a temperature of from about 900° C. to about 1,000° C. (e.g., about 950° C.) for a duration of from about 5 seconds to about 10 seconds, would move the depletion region the above-described distance away from the re-growth interface.

Hereinafter, the base including doped epitaxial SiGe, Ge or III-V (and associated out-diffusion region) or epitaxial SiGe, Ge or III-V doped later in the process using, e.g., solid-source diffusion (see below) will be given reference numeral 702.

Figure 8:
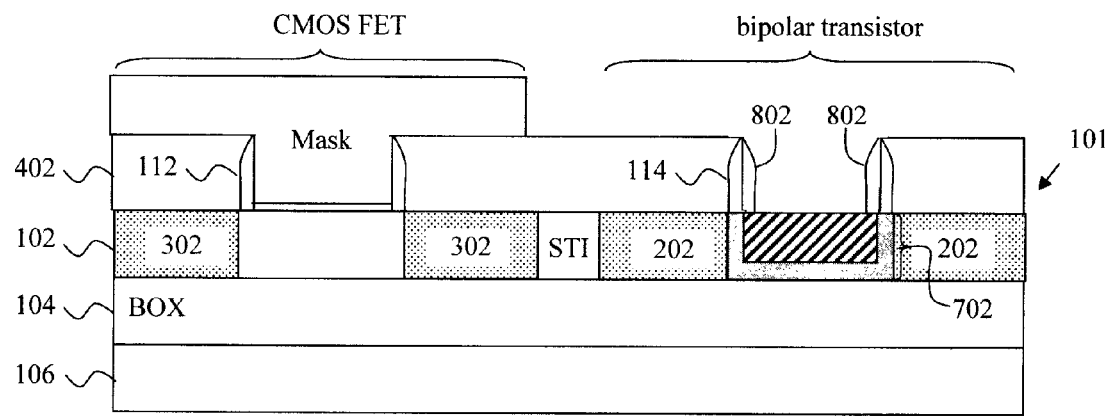
FIG. 8 is a cross-sectional diagram illustrating optional inner spacers having been formed in the bipolar transistor device(s) according to an embodiment of the present invention.

As shown in FIG. 8, optional inner spacers 802 can be formed in the bipolar transistor device(s). Placing spacers 802 between what will be the collector/emitter regions of the device and the device contact will help to minimize parasitic capacitance in the completed device. According to an exemplary embodiment, spacers 802 are formed by first depositing a nitride layer into the trench. A resist film is then deposited on the nitride layer, masked and patterned with the spacer footprints. A nitride-selective RIE is then used to define spacers in the nitride layer. The CMOS FET device(s) remain masked during this inner spacer formation process. The remainder of the steps of the process will be illustrated in the figures with the optional inner spacers present, however the same steps would be performed, in the same manner described, whether or not the inner spacers 802 are present.

According to the instant example, processing of the CMOS FET device(s) is now conducted in order to form a replacement gate in the FET device(s). To do so, any masking present over the CMOS FET device(s) is removed. As described above, in this example, the dummy gate has already been removed selective to the dielectric filler layer and spacers. This step (illustrated in FIG. 5) was performed concurrently in both the CMOS FET and bipolar transistor devices. However, it is possible to leave the CMOS FET dummy gate(s) in place until this point when the replacement gate is formed. Regardless, removal of the dummy gate(s) in the CMOS FET device(s) results in a trench(es) being formed in the dielectric filler layer.

Figure 9:
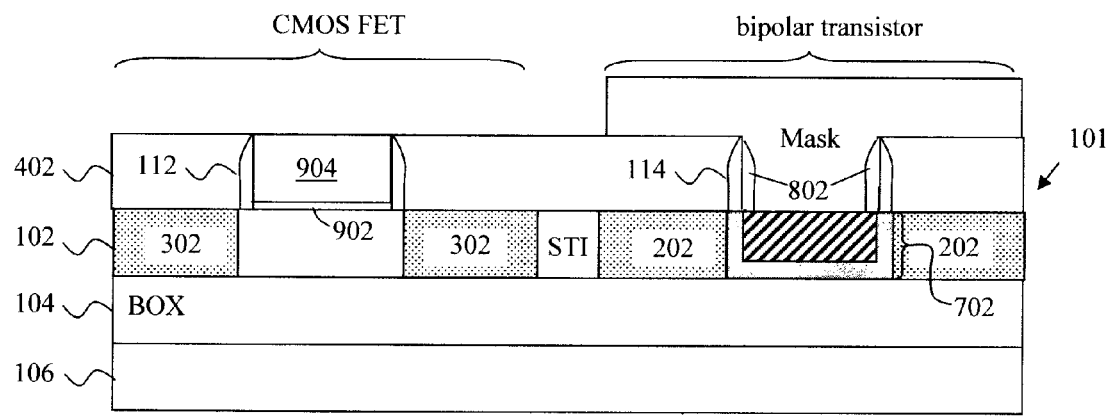
FIG. 9 is a cross-sectional diagram illustrating a replacement gate stack(s) having been formed over the CMOS FET device(s) while the bipolar transistor device(s) are masked according to an embodiment of the present invention.
Figure 10:
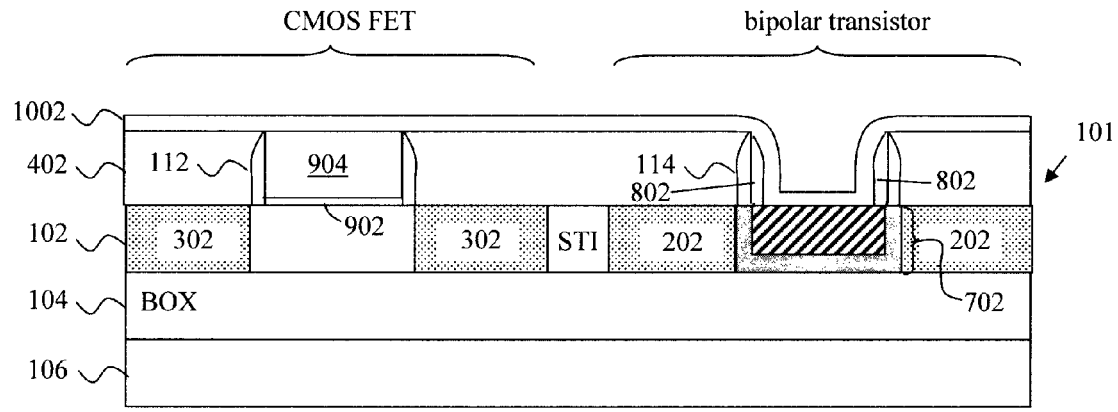
FIG. 10 is a cross-sectional diagram illustrating a layer of polysilicon having been blanket deposited onto the wafer, covering the CMOS FET device(s) and bipolar transistor devices according to an embodiment of the present invention.

As shown in FIG. 9, masking (e.g., resist or hardmask) is first needed to block off the bipolar transistor device(s) during the CMOS FET replacement gate process. Next a replacement gate stack(s) is/are formed in the trench(es) in the dielectric filler layer over the CMOS FET device(s). According to an exemplary embodiment, the replacement gate stack(s) include a gate dielectric 902 and a gate electrode 904. The gate dielectric separates the gate electrode from the portion of the SOI that will serve as a channel region of the CMOS FET device(s). In general, each FET will include a source region and a drain region interconnected by a channel region, and a gate electrode over the channel region that regulates electron flow through the channel.

The gate electrode can be formed from a metal or combination of metals and/or doped polysilicon. For a metal gate, a high-k dielectric, such as hafnium oxide, is preferred. As provided above, a dummy gate dielectric was employed as an etch stop earlier in the process. Any of this dummy gate dielectric remaining is preferably removed and replaced with the gate dielectric 902. Following formation of the replacement gate stack(s) in the CMOS FET device(s), the masking over the bipolar transistor device(s) can be removed.

As provided above, the base region(s) of the bipolar transistor device(s) may have already been doped, in situ, during re-growth of the (SiGe, Ge, or III-V) base material. If so, then the process now described for doping the base is unnecessary. On the other hand, if the base is yet undoped, then according to an exemplary embodiment, the base region(s) of the bipolar transistor device(s) are now doped using either solid source diffusion or doping agent implant. With solid source diffusion, a dopant-containing material (the solid source) is deposited on the semiconductor to be doped. Suitable dopant-containing materials include, but are not limited to, borosilicate glass (BSG), phospho-silicate glass (PSG), and doped germanium. An anneal is then performed at a temperature of from about 900° C. to about 1,000° C. to allow the dopants in the dopant-containing material or solid-source to diffuse into the semiconductor. The solid source can then be removed using, for example, a hydrofluoric acid (HF) dip. Alternatively, the base implant doping can be applied at an angle to the perpendicular to fine tune the desired base-collector doping level gradient. According to an exemplary embodiment, suitable doping agents include, but are not limited to, boron (p-type) or phosphorous (n-type).

Next, a gate electrode contact is formed in the CMOS FET device(s) and a base contact is formed in the bipolar FET device(s). While the following description and related figures describe these contact-forming processes as being performed concurrently in the CMOS FET and bipolar transistor devices, it is of course possible to process the devices separately, using selective masking as described above. To begin the contact formation process, a layer of polysilicon 1002 is blanket deposited onto the wafer, covering the CMOS FET device(s) and bipolar transistor devices. See FIG. 10. According to an exemplary embodiment, the polysilicon layer 1002 is deposited to a thickness of from about 5 nanometers (nm) to about 30 nm, e.g., from about 10 nm to about 15 nm.

Figure 11:
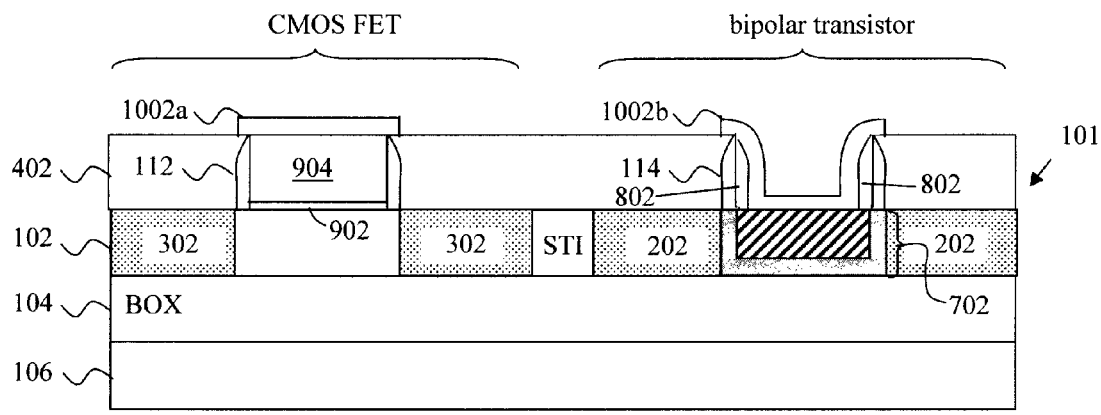
FIG. 11 is a cross-sectional diagram illustrating the polysilicon layer having been removed from over all but the gate electrode in the CMOS FET device(s) and the base of the bipolar transistor device(s) according to an embodiment of the present invention.

Standard lithography and etching techniques are then used to pattern the polysilicon layer 1002, to remove the polysilicon layer from over all but the gate electrode 904 in the CMOS FET device(s) and the base 702 of the bipolar transistor device(s). For clarity of description, these remaining portions of the polysilicon layer are hereinafter referred to herein by the reference numerals 1002a and 1002b, respectively. See FIG. 11. As shown in FIG. 11, the patterned polysilicon layer 1002a and 1002b covering the spacers preferably remains.

A self-aligned silicide (a salicide) is then formed to produce gate electrode and base contacts 1202a and 1202b in the CMOS FET and bipolar transistor devices, respectively. See FIG. 12. To begin the salicide process, a silicide metal is first blanket deposited onto the wafer (using, e.g., sputtering, evaporation, etc.). Suitable silicide metals include, but are not limited to, nickel, platinum, and combinations thereof such as nickel platinum. The process is self-aligned since the silicide will form only in areas where the silicide metal is in contact with the semiconductor (in this case the polysilicon 1002a and 1002b).

Next, an anneal is performed, for example, at a temperature of from about 500° C. to about 1,100° C. for a duration of from about 5 seconds to about 10 seconds, to react the metal with the semiconductor forming a metal silicide. This metal silicide forms the gate electrode and base contacts 1202a and 1202b in the CMOS FET and bipolar transistor devices, respectively. Any unreacted metal can be stripped using a wet etching process. While this silicidation process is generally described herein as a one step anneal (e.g., deposit metal, anneal, strip unreacted metal), it is possible and in some cases preferable to employ a multi-step annealing process (e.g., deposit metal, anneal at a first temperature, strip metal, anneal at a second, higher temperature).

Figure 12:
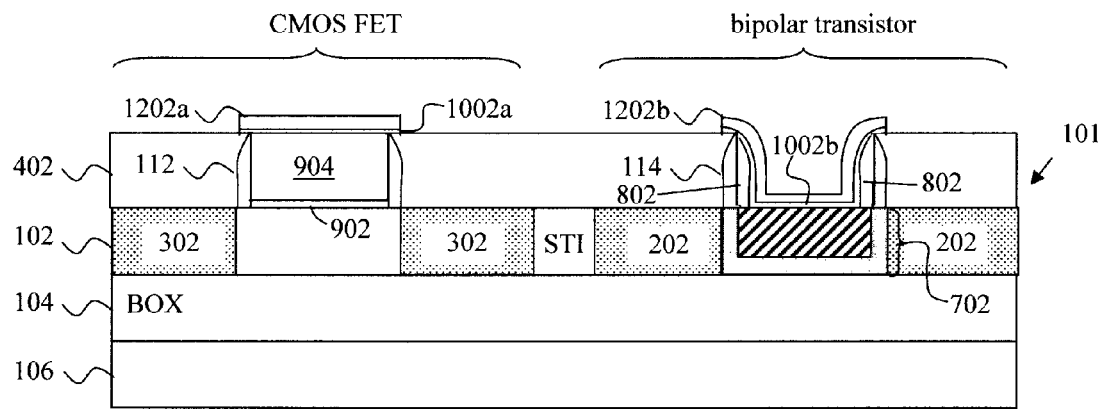
FIG. 12 is a cross-sectional diagram illustrating a self-aligned silicide having been formed to produce gate electrode and base contacts in the CMOS FET and bipolar transistor devices according to an embodiment of the present invention.

As shown in FIG. 12, a portion of the polysilicon 1002a/1002b can remain under the silicide of the contacts 1202a and 1202b. The amount of silicide formed can be controlled based on one or more of the amount of metal deposited, the anneal temperature, duration, etc.

The above-described process is merely one example of how CMOS FETs and bipolar transistor devices can be co-fabricated on a wafer. As provided above, co-fabrication is also an exemplary implementation of the present techniques, as the above-described process can be used in the same manner to fabricate solely CMOS FETS or (SiGe, Ge, III-V material-based) bipolar transistors. Further, some notable alternative steps to the above-described process can be employed. These alternative embodiments are now described.

For example, in one alternative embodiment, the silicidation contact-forming process is used, in addition to forming the gate electrode and base contacts as described above, to also form source/drain and emitter/collector contacts. Namely, following from FIG. 9, the dielectric filler layer 402 is in this case removed (using, e.g., a wet or dry etch). See FIG. 13.

Following removal of the dielectric filler layer, a self-aligned silicide (a salicide) is used to (concurrently) form in the CMOS FET device(s): source/drain contacts 1302 and gate electrode contact 1304, and in the bipolar transistor device(s): emitter/collect contacts 1306 and base contact 1308. It is notable that in order for the gate electrode contact 1304 to be formed by this silicidation process, the (replacement) gate electrode 904 has to include a semiconductor material (such as polysilicon).

In the same manner as described above, to begin the silicidation process, a silicide metal (e.g., nickel, platinum, nickel platinum, etc.) is first blanket deposited onto the wafer. The process is self-aligned since the silicide will form only in areas where the silicide metal is in contact with the semiconductor (in this case the CMOS FET source, drain, and gate electrode, and the bipolar transistor collector, emitter and base).

Next, an anneal is performed, for example, at a temperature of from about 500° C. to about 1,100° C., for a duration of from about 5 seconds to about 10 seconds, to react the metal with the semiconductor forming a metal silicide. Any unreacted metal can be stripped using a wet etching process. As provided above, the silicidation can be performed as a one or multi-step annealing process.

Figure 13:
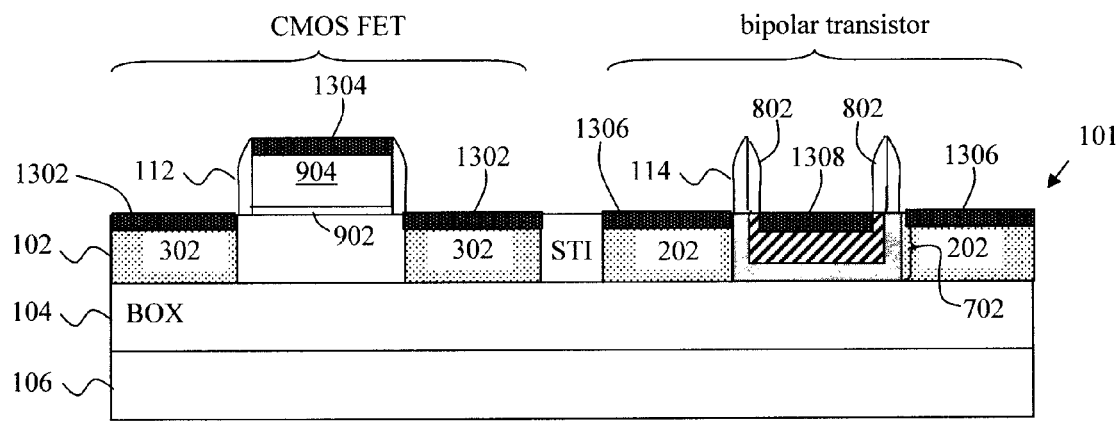
FIG. 13 is a cross-sectional diagram, following from FIG. 9, which illustrates an alternative embodiment wherein the dielectric filler layer has been removed, and a self-aligned silicide having been used to form source/drain contacts and a gate electrode contact in the CMOS FET device(s), and emitter/collect contacts and a base contact in the bipolar transistor device(s) according to an embodiment of the present invention.
Figure 14:
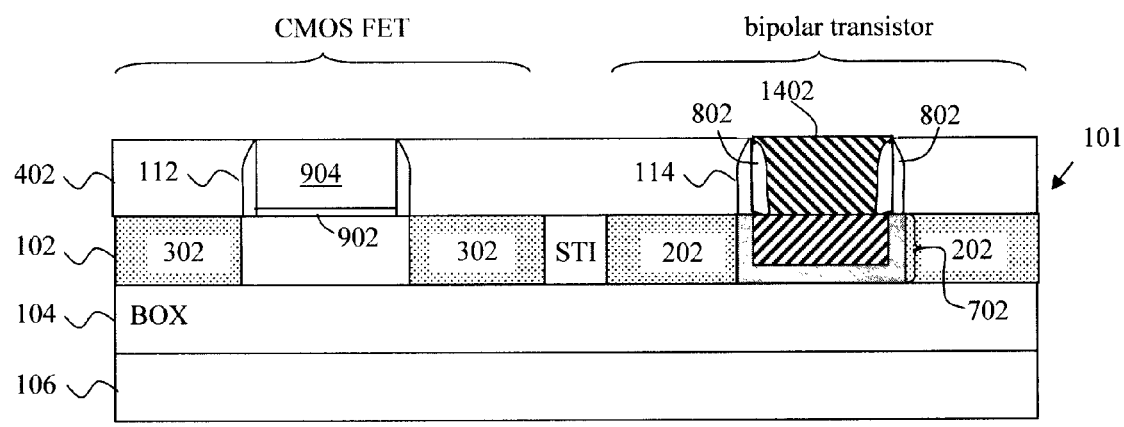
FIG. 14 is a cross-sectional diagram, following from FIG. 9, which illustrates another alternative embodiment wherein epitaxy is used to thicken the base in the bipolar transistor device(s) according to an embodiment of the present invention.
Figure 15:
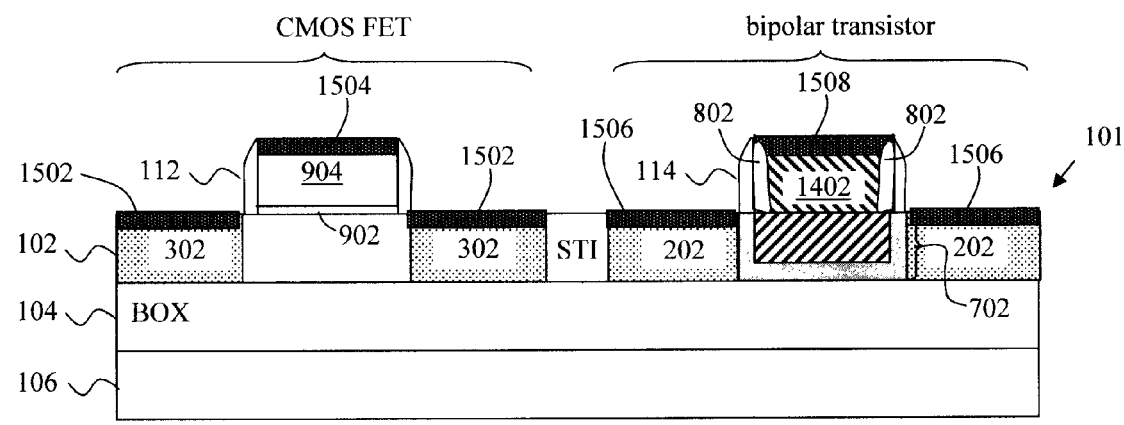
FIG. 15 is a cross-sectional diagram, following from FIG. 14, which illustrates the dielectric filler layer having been removed, and a self-aligned silicide having been used to form source/drain contacts and a gate electrode contact in the CMOS FET device(s), and emitter/collect contacts and a base contact in the bipolar transistor device(s) according to an embodiment of the present invention.

In yet another exemplary alternative embodiment, the same process as illustrated in FIG. 13 is performed to form CMOS FET source/drain and gate electrode contacts, and bipolar transistor emitter/collector and base contacts, however prior to removal of the dielectric filler layer epitaxy is used to build up the bipolar transistor base. Namely, again starting with the structure of FIG. 9, epitaxy is used to thicken the base 702. It is notable that by this stage in the process the base 702 has already been doped, see above. Here, the epitaxy is being used simply to thicken the base. According to an exemplary embodiment, epitaxial SiGe, Ge or a III-V semiconductor material is grown over base 702. Any excess epitaxial material can be removed (e.g., using chemical mechanical polishing (CMP)) such that the remaining extended base 1402 is flush with the dielectric filler layer. See FIG. 14.

Next, in the same manner as described in conjunction with the description of FIG. 13, above, the dielectric filler layer is removed (using wet or dry etching) and a self-aligned silicide (a salicide) is used to (concurrently) form in the CMOS FET device(s): source/drain contacts 1502 and gate electrode contact 1504, and in the bipolar transistor device(s): emitter/collect contacts 1506 and base contact 1508. See FIG. 15.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of co-fabricating at least one CMOS FET device and at least one bipolar transistor device on a wafer, the method comprising the steps of:
    forming at least one CMOS FET dummy gate and at least one bipolar transistor dummy gate on the wafer, wherein the CMOS FET dummy gate is present over a portion of the wafer that serves as a channel region of the CMOS FET device and the bipolar transistor dummy gate is present over a portion of the wafer that serves as a base of the bipolar transistor;

doping the wafer to form emitter and collector regions on both sides of the bipolar transistor dummy gate;

doping the wafer to form source and drain regions on both sides of the CMOS FET dummy gate;

depositing a dielectric filler layer onto the wafer surrounding the CMOS FET dummy gate and the bipolar transistor dummy gate;

removing the CMOS FET dummy gate and the bipolar transistor dummy gate selective to the dielectric filler layer, wherein removal of the CMOS FET dummy gate results in at least one first trench being formed in the dielectric filler layer and removal of the bipolar transistor dummy gate results in at least one second trench being formed in the dielectric filler layer;

recessing the base of the bipolar transistor;

re-growing the base of the bipolar transistor from an epitaxial material selected from the group consisting of: SiGe, Ge, and a III-V material;

forming a replacement gate of the CMOS FET device in the first trench over the channel region of the CMOS FET device; and forming contacts to the replacement gate of the CMOS FET device and to the base of the bipolar transistor device.

2. The method of claim 1, further comprising the step of:
forming spacers on opposite sides of the CMOS FET dummy gate and on opposite sides of the bipolar transistor dummy gate.

3. The method of claim 2, further comprising the step of forming inner spacers in the bipolar transistor device.

4. The method of claim 1, wherein the base of the bipolar transistor is re-grown from a III-V epitaxial material selected from the group consisting of aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium nitride, indium nitride, indium phosphide and combinations comprising at least one of the foregoing materials.

5. The method of claim 1, further comprising the step of:
doping the base of the bipolar transistor, in situ, during re-growth of the base from the epitaxial material.

6. The method of claim 1, further comprising the step of:
doping the base of the bipolar transistor using solid source diffusion.

7. The method of claim 1, wherein the step of forming contacts to the replacement gate of the CMOS FET device and to the base of the bipolar transistor device comprises the steps of depositing a polysilicon layer onto the wafer covering the CMOS FET device and the bipolar transistor device;

patterning the polysilicon layer such that the polysilicon layer remains only on the replacement gate of the CMOS FET device and on the base of the bipolar transistor;

depositing a metal onto the wafer;

reacting the metal with the patterned polysilicon layer to form the contacts to the replacement gate of the CMOS FET device and to the base of the bipolar transistor device; and removing any unreacted metal.

8. The method of claim 1, further comprising the step of:
forming contacts to the source and drain regions of the CMOS FET device and to the emitter and collector regions of the bipolar transistor device.

9. The method of claim 8, further comprising the steps of:
removing the dielectric filler layer;
depositing a metal onto the wafer;
reacting the metal with the source and drain regions to form the contacts to the source and drain regions of the CMOS FET device and reacting the metal with the emitter and collector regions to form the contacts to the emitter and collector regions of the bipolar transistor device.

10. The method of claim 9, further comprising the step of:
thickening the base of the bipolar transistor device using epitaxy.

* * * * *